United States Patent [19]

Roy

[11] Patent Number: 5,398,161

[45] Date of Patent: Mar. 14, 1995

[54] TELECOMMUNICATIONS SWITCH CHASSIS HAVING HOUSING WITH FRONT AND REAR COMPARTMENTS DIVIDED BY INTERIOR PARTITION AND REMOVABLE COVER OVER REAR COMPARTMENT

[75] Inventor: Christopher E. Roy, Plymouth, Mass.

[73] Assignee: Excel, Inc., Sagamore Beach, Mass.

[21] Appl. No.: 97,072

[22] Filed: Jul. 23, 1993

[51] Int. Cl.⁶ .......................... H05K 7/14; H05K 7/20
[52] U.S. Cl. ..................................... 361/727; 361/685;
                                       361/695; 361/752; 361/788; 361/796
[58] Field of Search ................. 439/59, 61; 364/708.1;
         361/679–686, 724–728, 730, 687, 736, 741, 695,
                          752, 756, 788, 796, 797, 802, 803

[56] References Cited

U.S. PATENT DOCUMENTS

| | | | |
|---|---|---|---|
| 3,925,710 | 12/1975 | Ebert | 361/686 X |
| 4,899,254 | 2/1990 | Ferchou et al. | 361/685 X |
| 4,901,202 | 2/1990 | Leschinger | 361/724 |

*Primary Examiner*—Michael W. Phillips
*Attorney, Agent, or Firm*—Cesari and McKenna

[57] ABSTRACT

A telecommunications switch chassis includes a generally rectangular housing whose interior is divided by a lateral partition into front and rear compartments. There is a large opening in the top wall of the housing over the rear compartment only which may be closed by a removable cover. There is also an opening in the front of the housing which is normally closed by a lockable door to provide controlled access to the front compartment of the housing. The rear compartment contains a printed circuit board with connectors for receiving and supporting on edge a plurality of PC-AT cards whose connectors are accessible through openings in the rear wall of the housing so that exterior cables can be connected to those cards. All of these cards are readily accessible for replacement or repair by removing the cover over the rear compartment. The front compartment contains a rack for supporting redundant DC/DC power supply cards or alternatively an AC power supply. The front compartment also contains a plurality of slide-in memory drives. Access to the dangerous or sensitive components of the switch, as well as to certain controls thereof, can only be had by opening a locked door at the front of the housing. Easily removable fans circulate cooling air through the housing. Also, an optional display may be provided in the door of the chassis.

17 Claims, 2 Drawing Sheets

TELECOMMUNICATIONS SWITCH CHASSIS HAVING HOUSING WITH FRONT AND REAR COMPARTMENTS DIVIDED BY INTERIOR PARTITION AND REMOVABLE COVER OVER REAR COMPARTMENT

FIELD OF THE INVENTION

This invention relates to a telecommunications switch. It relates more particularly to an improved chassis for such a switch.

BACKGROUND OF THE INVENTION

A telecommunications switch is used to route message traffic over a network. Usually it comprises a chassis or housing containing circuitry on a multiplicity of printed circuit cards which plug into a motherboard in the chassis. The various communications lines are plugged into connectors on those cards, the connectors being exposed at openings in the back of the chassis. The actual switching may be controlled by a central processor unit (CPA) on the motherboard in accordance with programs and instructions provided from disc drives in the chassis or from an external keyboard. The chassis usually also contains a power supply for supplying power to the various parts of the switch.

Many present clay switch chassis and housings are disadvantaged in that they are relatively complicated to assemble. Also, their interiors are not organized to facilitate the installation and servicing of the various parts which make up the switch such as printed circuit cards, disc drives, cooling fans, etc. Furthermore, the interior layouts of the chassis are not very flexible in that they do not take into account the fact that some switches may require more or different memory storage than others, or some may need a DC power supply rather than an AC supply or redundant supplies.

Another area which is not addressed sufficiently by prior switch chassis constructions is accessibility both in terms of security and personal safety. In many cases, parts of the switch which have to be reached for routine replacement or repair, the low voltage PC-AT cards for example, are located near disk drives which may carry sensitive information or near dangerous high voltage power supplies.

What is needed, then, is a switch chassis design which takes all of these things into consideration, yet is manufacturable at a reasonable cost.

SUMMARY OF THE INVENTION

Accordingly, it is an object of the present invention to provide an improved chassis for a telecommunications switch.

A further object of the invention is to provide a telecommunications switch chassis which can accommodate a variety of different switch configurations without internal chassis modifications.

Another object is to provide a switch chassis which provides easy access to non-sensitive circuits and subsystems in the chassis housing for repair purposes.

Still another object is to provide a chassis of this type which restricts access to dangerous or sensitive parts of the switch.

Another object is to provide a switch chassis which accommodates AC or DC power to the switch components without internal chassis modifications.

A further object is to provide a telecommunications switch chassis which is relatively easy to make and to assemble.

Other objects will, in part, be obvious, and, will, in part, appear hereinafter. The invention accordingly comprises the features of construction, combination of elements and arrangement of parts which will be exemplified in the following detailed description, and the scope of the invention will be indicated in the claims.

Briefly, the telecommunications switch chassis comprises a rugged housing having a bottom wall, a pair of opposite side walls, a rear wall and an interior lateral partition which divides the interior of the housing into front and rear compartments. The housing also includes a top wall which completely covers the front compartment, but leaves an opening over the rear compartment. That opening may be closed by a removable cover. Positioned in the rear compartment is a printed circuit motherboard which includes the necessary processing circuitry to operate the switch, as well as connectors for receiving and supporting a plurality of PC-AT cards whose connectors are accessible through openings in the rear wall of the housing so that external communications cables can be connected to those cards.

The front compartment of the housing, accessible only by opening a locked door at the front of the housing, includes a rack for supporting power supply means which provide all of the necessary DC voltages required by the switch. The power supply means may be in the form of redundant DC-DC power supply cards or an AC-DC power supply, all of the supplies being able to plug into the same power bus at the rear of the front compartment so that the AC and DC supplies are completely interchangeable.

The front compartment also contains a plurality of slide-in in memory drives for supporting the operation of the switch. These drives may be tape drives, hard disc drives or floppy disc drives or any combination thereof. Access to the potentially dangerous power supplies and memory drives which may contain sensitive information may be had only by opening the locked door into the front compartment. On the other hand, the PC-AT cards in the rear compartment are readily accessible to maintenance personnel by removing the cover over that compartment.

The chassis has an AC or DC fan unit removably mounted inside the housing adjacent to the partition therein for circulating air through vent openings in the door and the housing rear wall in order to cool the power supply means and other circuitry inside the housing.

The chassis also includes the necessary controls for operating the switch, with the more critical or sensitive controls being located behind the door into the front compartment so that they are only accessible by unlocking and opening that door. As will be described in more detail later, receptacles are provided at both the front and rear of the chassis so that an external keyboard can be connected to the chassis from either end. Also, a flat panel display may be exposed at an opening in the housing door to enable one to monitor the operation of the switch.

As will be seen from the following detailed description, the components of the chassis are relatively easy and inexpensive to make and to assemble and the chassis construction allows considerably flexibility in the makeup of the chassis in terms of the number and type of power supplies, the number and type of memory drives and the number and type of PC-AT cards. For example, one of the PC-AT cards may be substituted for by an alarm card which can monitor selected circuit conditions to trigger watchdog relays to control external alarms. All of these features should give this telecommunications switch chassis a competitive advantage in the marketplace.

BRIEF DESCRIPTION OF THE DRAWINGS

For a fuller understanding of the nature and objects of the invention, reference should be had to the following detailed description, taken in connection with the accompanying drawings, in which.

DETAILED DESCRIPTION OF PREFERRED EMBODIMENT

Figure 1:
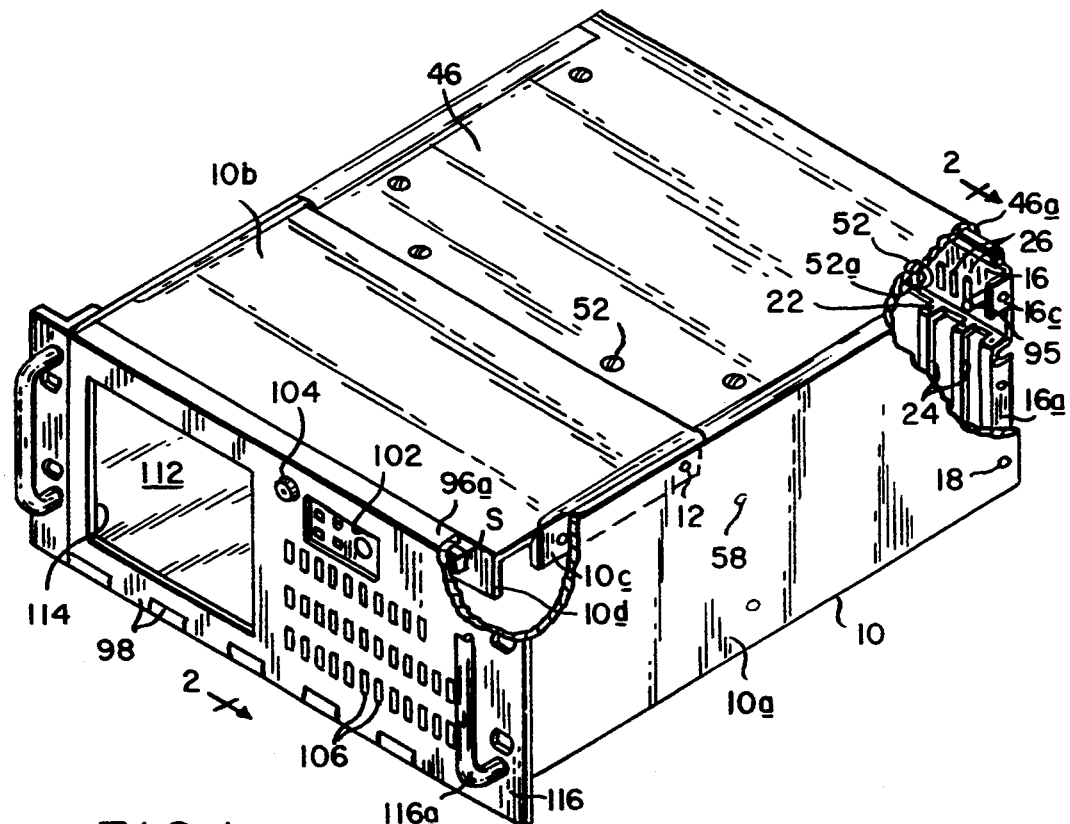
FIG. 1 is all isometric view with parts broken away showing a telecommunications switch chassis embodying the invention.
Figure 2:
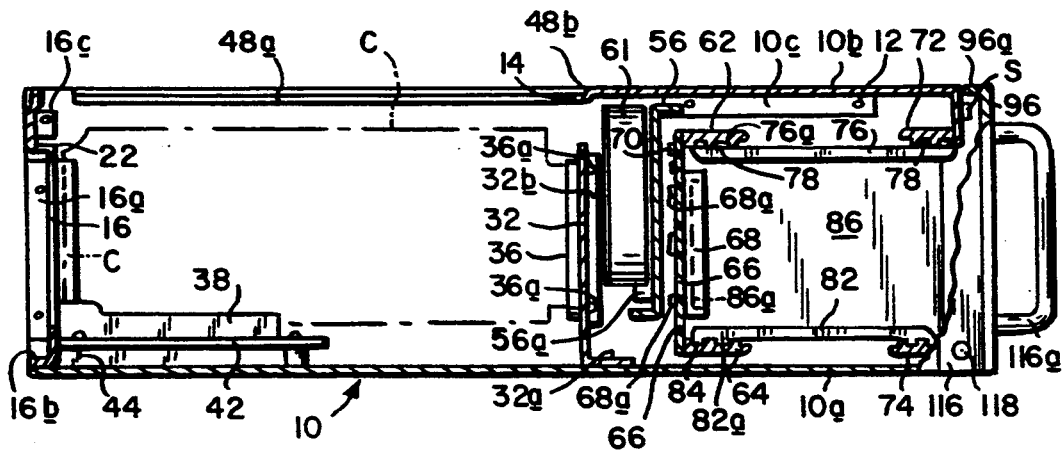
FIG. 2 is a side elevational view with parts broken away of the FIG. 1 chassis.

Referring to FIGS. 1 and 2, the chassis includes a housing or enclosure 10 composed of a generally U-shaped channel 10a which forms the bottom and side walls of the housing. The housing also has a flat top wall 10b with depending side flanges 10c to which the upper side edges of the channel 10a are connected by sheet metal screws 12. The housing top wall 10b only extends part way along channel 10a leaving a relatively large top opening 14, best seen in FIGS. 2 and 3, to provide ready access to certain printed circuit cards comprising the switch as will be described in more detail later.

The rear end of housing channel 10a is closed by a wall 16 having opposite rearwardly extending side flanges 16a, a rearwardly extending bottom flange 16b and a pair of forwardly extending tabs 16c at the upper corners of that wall. The channel 10a is connected along its edges to those flanges and tabs by sheet metal screws 18 or other suitable fasteners. Preferably, the rear wall 16 is stepped about two thirds of the way up on that wall to provide an internal shoulder or step 22 which rigidifies that wall and defines the upper boundary of a series of relatively large vertical access slots 24, the series of slots extending substantially the entire width of housing 10. Additional smaller vertical slots 26 are provided in rear wall 16 above shoulder 22 for ventilation purposes.

Figure 3:
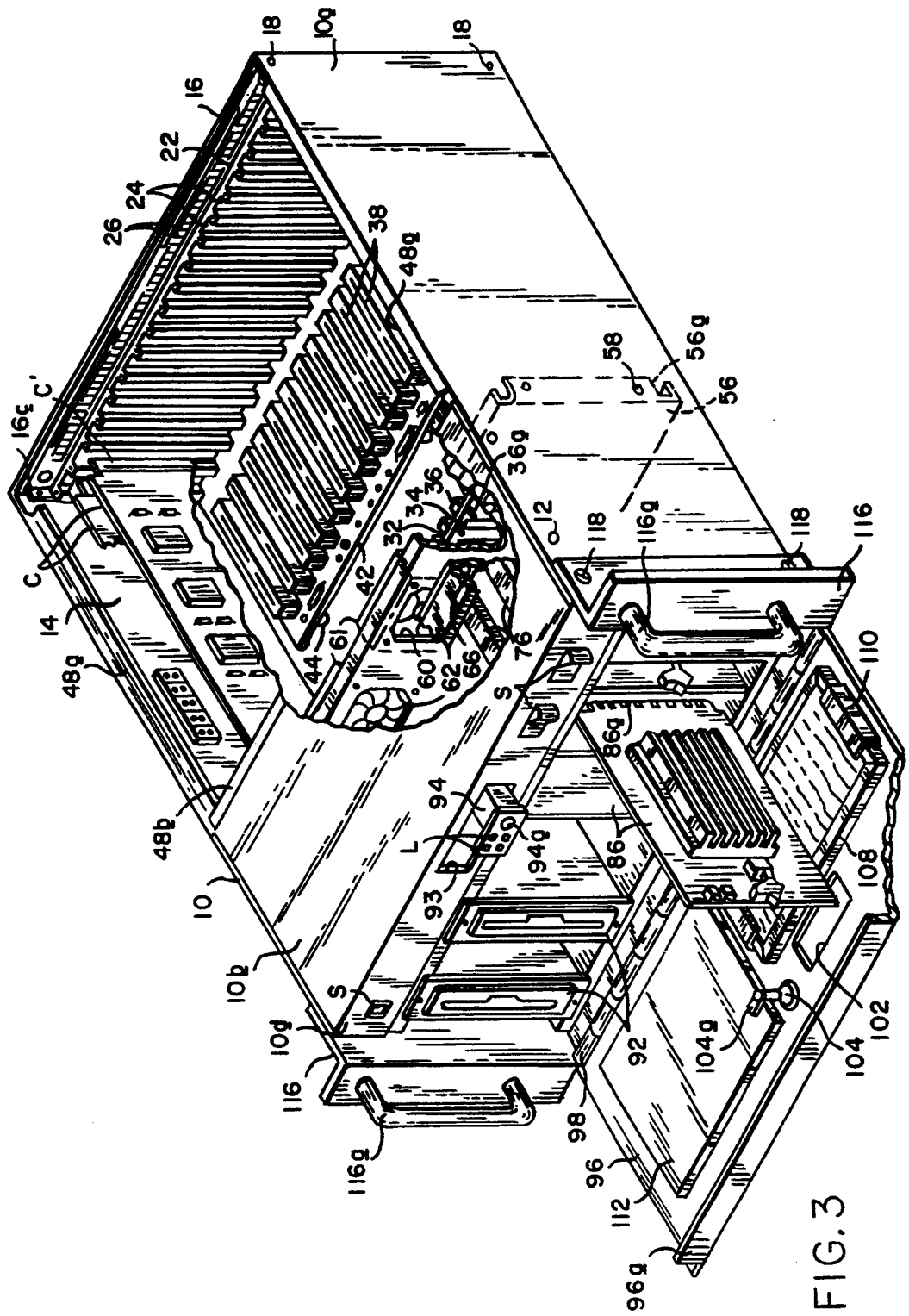
FIG. 3 is an isometric view on a larger scale, with parts broken away, showing the chassis with its front access door in the open position and with its top access panel removed.

Referring to FIGS. 2 and 3, the interior of housing 10 is divided front to back at the forward edge of top wall opening 14 by an upstanding steel wall or partition 32 having bottom and end flanges 32a and 32b, respectively, which are secured to the bottom and side walls, respectively, of housing 10 by appropriate fastening means (not shown). The partition 32 is formed with vertical slots 34 so that air can be circulated through the partition 32 as will be described later. Mounted to the partition between the slots is a series of vertical caret guides 36 for receiving and supporting relatively large so-called PC-AT printed circuit cards C (shown in phantom in FIG. 2). Preferably, the card guides are formed in partition 32 by a special tool which produces what is referred to as "lanced card guides".

As shown in FIGS. 2 and 3, the printed circuit cards C are also arranged to plug into a series of female connectors 38 mounted to a printed circuit board 42 which constitutes a passive back plane. The board 42 is spaced above the housing bottom wall by posts 44 and includes a microprocessor for controlling the switching functions of the switch. The slides 36 and connectors 38 are aligned with the slots 24 in the housing rear wall 16 so that when each printed circuit card C is received in a slide 36 and plugged into the corresponding connector 38, its rear edge will be aligned with a slot 24. Resultantly, connectors C' mounted to the rear edges of cards C will be accessible through wall slots 24 so that external cables can be plugged into the various connectors C'. The illustrated switch chassis accommodates up to 20 PC-AT cards C. All of those cards can be installed and removed from the chassis through the top opening 14 of housing 10, allowing for very easy servicing of those cards.

Referring to FIGS. 1 and 3, opening 14 may be closed by an appropriate cover 46 whose side and front edges rest on recessed in-turned flanges 48a and 48b at the upper side edges of housing channel 10a and at the rear edge housing top wall 1012, respectively, there being also a depending flange 46a at the rear of the cover which engages over the housing rear wall 16 as shown in FIG. 1. The cover may be releasably held in place by turn buttons 52 which support stiff semicircular springs or wires 52a which can be rotated under flanges 48a and 48b by turning the turn buttons 52 through an angle of 90°.

Referring to FIGS. 2 and 3, positioned just forwardly of partition 32 is a plate or tray 56 having opposite side flanges 56a which are anchored to the housing side walls by appropriate removable fasteners 58. Plate 56 is provided with relatively large openings 60 spaced along its length. Mounted to plate 56 at the openings 60 are electric fans 61 designed to draw in cooling air from the front of housing 10 and circulate that air past the printed circuit cards C, with the air being discharged through the slots 24, 26 at the rear of the housing. The fans 62 may be AC or DC fans and can be replaced or updated all at once depending upon which power supply is in the switch without internal chassis modifications simply by removing and replacing the tray 56 through opening 14.

Still referring to FIGS. 2 and 3, spaced forwardly of the fan tray 56 are a pair of upper and lower horizontal rails 62 and 64. These rails extend between the side walls of channel 10a, with the opposite ends of those rails being secured to the side walls by suitable fasteners (not shown). Mounted to the rear edges of rails 62 and 64 is a circuit board 66 which extends between the rails. Circuit board 66 supports a series of vertical card connectors 68 (FIG. 2) which are spaced along the plate. For easy installation, the connectors 68 may be provided with rear tabs 68a which are pressed into appropriate holes (not shown) in circuit board 66. Printed circuit board 66 carries various printed power buses and circuits needed to connect connectors 68 to fans 61 and to other electrical components inside the housing.

Spaced in front of rails 62 and 64 at the forward end of housing 10 is a second pair of upper and lower rails 72 and 74 which extend between the side walls of housing channel 10a parallel to rails 62 and 64. The upper rails 62 and 72 support a set of slides 76 which extend fore and aft, there being a slide 76 located above each connector 68. The slides may be supported from the rails by rear tabs 76a press fit into appropriate holes or longitudinal channels 78 formed in the undersides of the rails 62 and 72.

A second set of fore and aft slides 82 are supported in a similar fashion by the lower pair of rail 64 and 74. These slides 82 are located directly below slides 76 and are aligned with the connectors 68, the slides having rear tabs 82a which are press fitted into holes or channels 84 in the upper surfaces of rails 64 and 74.

As shown in FIGS. 1 and 2, the slides 76 and 82 are arranged to slidably receive printed circuit cards or modules 86 inserted through the open front of housing 10a. When the cards are slid into place, the rear edges 86a of those cards plug into connectors 68 on circuit board 66 so that contact pads at those edges connect electrically with corresponding contacts inside the connectors. A typical chassis contains slots or positions for cards 86 to supply all of the DC to DC power outputs to meet the industrial PC-AT power specifications for the telecommunications switch. Usually, these voltage outputs are +5 V, −5 V, +12 V, −12 V based on a 48 V DC input. These DC/DC supplies may be implemented on three cards or modules 86 which are received in three different types of power slots (+5 V slot, a +12 V slot and a −5 V/−12 V slot). Preferably the three slots are keyed to prevent a card 86 from being plugged into the wrong slot anti wrong connector 68.

The illustrated chassis is further advantaged in that it has another three card positions or slots for accommodating a duplicate set of cards 86 to supply redundancy on all PC-AT power buses. The 48 V DC power inputs may be provided to the two sets of cards 86 by way of appropriate duplicate circuit breakers (not shown) inside the housing.

The printed circuit board 66 and connectors 68 are designed and arranged to provide a universal power back plane. This allows the cards 86 to be replaced by a single AC/DC supply (not shown) which will supply all of the necessary PC-AT power to the switch without requiring any internal chassis modifications. In other words, the AC/DC supply is provided with contacts that will plug into connectors 68 to make the necessary connections to the power bus on printed circuit board 66.

As best seen in FIG. 3, the remaining space in housing 10 in front of the fan tray 56 at the right side of the housing may be used to house the memory needed to support the switch. The illustrated chassis will hold up to four memory drives which may be tape drives, floppy disc drives, optical drives, hard disc drives or any combination of same. Each drive is slid into housing 10 through the open front of housing channel 10a and is mounted in the usual way to the rails 72 and 74 at the front of the housing, using the customary threaded fasteners. Flexible circuits may be used to connect the various drives 92 to the printed circuit boards 42 and/or 66.

As seen in FIG. 3, various critical switches S for controlling the switch are mounted to a flange 10d extending down from a forward edge of the housing top wall 10b and are exposed through openings in that flange. Also, projecting out through an extra long rectangular opening 93 in that flange is an electrical connector 94 having a recepticle 94a for receiving the plug from a keyboard. The illustrated connector also supports an array of indicating lights L which may provide an indication of various aspects of switch operation.

A similar keyboard connector 95 is usually provided in housing rear wall 16 as seen in FIG. 1.

Referring to FIGS. 1 and 3, the opening in the front of housing channel 10a may be closed by a door 96 whose lower edge is connected by a hinge 98 to the forward edge of the housing bottom wall formed by the channel 10a. Door 96 may be swung between a closed position shown in FIG. 1 and an open position illustrated in FIG. 3. Preferably, there is a flange 96a at the door edge opposite hinge 98 which engages over switches S and connector 94 when the door is in its closed position shown in FIG. 1.

Door 96 is formed with a rectangular opening 102 which is positioned so that when the door is in its closed position shown in FIG. 1, the connector 94 and indicator lights L are exposed through that opening. Also, positioned next to the opening 102 in door 96 is a lock 104. When actuated by an appropriate key (not shown), the lock 104 may be turned so that a latch 104a thereof received in the opening 93 in the housing top wall flange 10c engages behind the upper or lower edge of that opening thereby locking the door 96 in its closed position.

Also formed in the housing door 96 is an array of vent holes 106 which, when door 96 is closed, are disposed opposite the section of the housing containing the power supply cards 86. Preferably, a filter unit 108 is positioned opposite the vent holes 106. The filter unit 108 may be slidably held in place by appropriate slides 110 mounted to the inside of the door as shown or to upper and lower front rails 78 and 74.

If desired, the switch chassis may include all associated display. In the illustrated embodiment of the invention, the display is built into the chassis door and takes the form of a backlit flat LCD panel display 112 mounted to the inside surface of door 96 and exposed through an opening 114 in the door. Thus, the switch does not require an external monitor.

In those cases where such a display is not needed, the opening 114 may be replaced by another filter similar to filter 108. In that event, the opening 114 would be substituted for by vent holes similar to vent holes 106 in order to provide additional ventilation for the switch components.

The illustrated switch chassis is provided with brackets 116 connected to the opposite sides of housing 10 by appropriate threaded fasteners 118. The brackets have handles 116a which project forwardly from the brackets to facilitate loading the chassis into a rack from the front. Of course, the brackets 116 may be relocated along the housing to accommodate mid or rear mounting of the chassis in a rack. Also, if the chassis is to be used in a desk top or tower mode, the brackets 116 may be removed.

It should be appreciated from the foregoing that the switch chassis described above meets all of the objectives of the invention. More particularly, the interior of the chassis is divided into front and rear compartments by the partition 32 and fan tray 56. Unobstructed access into the rear compartment which contains the PC-AT cards C may be had simply by removing the cover 46 using turn buttons 52. On the other hand, there is restricted access into the front compartment which contains the more dangerous components of the switch such as including the power supply cards 86 and the sensitive parts of the switch such as the data stored on the recording media in the various drives 92 and the control switches S. In order to gain access to those dangerous and sensitive parts of the chassis, one must have a key to the lock 104.

In the front compartment of the chassis, the DC/DC power supplies are implemented on three hot pluggable and hot removable circuit boards 86 all of which may be slid out through the front of the housing on their slides 76 and 82 when the door 96 is unlocked and open. Furthermore, all of the power supplies are duplicated so that there is redundancy on all of the PC-AT power buses.

The drives 92 in the front compartment of the housing can be configured with any combination of floppy drive, hard disc drive, tape drive, optical drive, etc. all of the drives being readily accessible at the front of the housing, but only when the door 96 is unlocked and open.

As discussed above, an AC/DC power supply can replace the DC/DC power supplies on cards 86 without internal chassis modifications to supply all of the necessary PC-AT power to the switch. Furthermore, the AC/DC supply can be plugged into the same connectors 68 used for the DC/DC supplies.

Sufficient ventilation to maintain the drives 92 and cards C and 86 at an acceptably low temperature is assured by the plurality of fans 61 which draw the air in through the vent holes 106 in the housing door 96 and expels the heated air through the slots 26 (and 24) in the rear wall 16 of the housing.

Yet with all of the above advantages, the chassis is relatively easy and inexpensive to make and to assemble, being constructed for the most part of relatively easily formed sheet metal and plastic parts which can be easily fastened or press fit together during assembly.

It will thus be seen that the objects set forth above, among those made apparent from the preceding description, are efficiently attained Also, certain changes may be made in the above construction without departing from the scope of the invention. For example, in some applications one of the 20 AC card slots (i.e., a connector 38) on the motherboard 42 may be filled with a PC-AT alarm card arranged to set off dry contact alarms if the PC-AT central processor unit or the mother board senses a malfunction in the switch, e.g., power failure, time out of a watch dog timer, etc.

Thus, it is intended that all matter contained in the above description or shown in the accompanying drawings shall be interpreted as illustrative and not in a limiting sense.

It is also to be understood that the following claims are intended to cover all of the generic and specific features of the invention described herein.

I claim:

1. A telecommunications switch chassis comprising a generally rectangular housing having a bottom wall, a pair of opposite side walls, a rear wall and an interior lateral partition dividing the interior of the housing into front and rear compartments each of said compartments having a top;
   a housing top wall closing the top of the front compartment;
   a removable cover closing the top of the rear compartment;
   a door at the front of the housing, said door being movable between a closed position wherein the door closes the front of the front compartment and an open position wherein the door allows front access to the front compartment;
   a printed circuit board positioned in the rear compartment, said board including a plurality of connectors for receiving and supporting printed circuit cards in spaced-apart relation in the rear compartment;
   means in the front compartment for supporting a plurality of memory drives;
   power supply means removably mounted in the front compartment, and
   circuit means for electrically interconnecting the power supply and the printed circuit board.

2. The chassis defined in claim 1 and further including means for locking said door.

3. The chassis defined in claim 1 wherein the power supply means include a plurality of printed circuit cards carrying redundant DC/DC power supplies.

4. The chassis defined in claim 1 wherein the power supply means include an AC/DC power supply.

5. The chassis defined in claim 1 and further including a plurality of printed circuit cards plugged into said connectors on said printed circuit board in the rear compartment.

6. The chassis defined in claim 1 and further including a plurality of memory drives supported by the support means in the front compartment, said memory drive being selected from the group consisting of floppy disc drive, hard disc drive, optical drive and tape drive.

7. The chassis defined in claim 1 and further including
   a plurality of vent holes in said partition, said door and at least one of said walls, and
   fan means in said housing for circulating air through said vent holes and said housing.

8. The chassis defined in claim 7 wherein said fan means include
   a removable support positioned in said housing adjacent to said partition, and
   one or more fans mounted to said support, said fans being replaceable simultaneously by removing said support.

9. The chassis defined in claim 8 wherein said fan means include one or more AC fans.

10. The chassis defined in claim 8 wherein said fan means include one or more DC fans.

11. The chassis defined in claim 1 and further including
    an aperture in said door, and
    an electronic display panel mounted to the inside of said door at said aperture.

12. The chassis defined in claim 1 wherein the power supply means comprise a back plane;
    a plurality of connectors mounted to the back plane and printed circuit power supply cards plugged into said connectors.

13. The chassis defined in claim 12 and further including sets of upper and lower slides for receiving and supporting said cards on edge.

14. A telecommunications switch chassis comprising a housing;
    a partition dividing the housing interior into front and rear compartment each of said compartments having a top; a housing top wall closing the top of the front compartment; a removable cover closing the top of the rear compartments;
    a printed circuit board positioned in the rear compartment, said board including a plurality of connectors for receiving and supporting printed circuit cards in spaced-apart relation in the rear compartment;
    a power back plane mounted in the front compartment, said back plane including a plurality of card connectors;

sets of upper and lower slides mounted in the front compartment, said slides extending fore and aft in alignment with said card connectors;

a plurality of power supply cards slidably received in said upper and lower slides and being connected to said card connectors, and a door on the front of the housing, said door being swingable between a closed position wherein the door closes the front of the front compartment and an open position wherein the door allows front access into the front compartment.

15. The chassis defined in claim 14 and further including a plurality of memory drives removably supported in the front compartment and connected electrically to said printed circuit board in the rear compartment and to said back plane.

16. The chassis defined in claim 15 and further including a fan unit removably mounted in said rear compartment adjacent to said partition and connected electrically to said back plane, and a plurality of vent openings in said door and at least one of the walls of said housing.

17. The chassis defined in claim 14 and further including a lock on said door.

* * * * *